(12) United States Patent
Morioka et al.

(10) Patent No.: US 7,763,831 B2
(45) Date of Patent: Jul. 27, 2010

(54) HEATING DEVICE

(75) Inventors: Ikuhisa Morioka, Handa (JP);
Yasufumi Aihara, Nagoya (JP);
Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 258 days.

(21) Appl. No.: 11/939,760

(22) Filed: Nov. 14, 2007

(65) Prior Publication Data

US 2008/0142501 A1    Jun. 19, 2008

Related U.S. Application Data

(60) Provisional application No. 60/870,109, filed on Dec. 15, 2006.

(51) Int. Cl.
*H05B 3/68* (2006.01)
*C23C 16/00* (2006.01)

(52) U.S. Cl. .................................. 219/444.1; 118/724

(58) Field of Classification Search ... 219/443.1–468.2, 219/544–548; 118/724, 725
See application file for complete search history.

(56) References Cited

U.S. PATENT DOCUMENTS

| | | | | |
|---|---|---|---|---|
| 5,851,298 A * | 12/1998 | Ishii | ........................... | 118/728 |
| 5,981,913 A * | 11/1999 | Kadomura et al. | ....... | 219/444.1 |
| 6,645,304 B2* | 11/2003 | Yamaguchi | .................. | 118/725 |
| 7,084,376 B2* | 8/2006 | Ito et al. | ................... | 219/444.1 |
| 2001/0006172 A1* | 7/2001 | Katsuda et al. | ........... | 219/444.1 |
| 2004/0040665 A1* | 3/2004 | Mizuno et al. | ......... | 156/345.51 |

FOREIGN PATENT DOCUMENTS

JP          09-249465 A1     9/1997

\* cited by examiner

*Primary Examiner*—Sang Y Paik
(74) *Attorney, Agent, or Firm*—Burr & Brown

(57) ABSTRACT

A heating device has a ceramic base with a heating surface, and a heating body embedded in the ceramic base. The heating device includes a thermal conductive member positioned between the heating surface and the heating body in the ceramic base. The thermal conductive member has a thermal conductivity that is higher than the ceramic base and as such, the heating device achieves superior temperature uniformity of a heated object particularly in a semiconductor device manufacturing process.

11 Claims, 2 Drawing Sheets

HEATING DEVICE

CROSS REFERENCE TO RELATED APPLICATIONS

This application is based upon and claims the benefit of priority from Provisional Patent Application No. 60/870,109 filed on Dec. 15, 2006 in the United States Patent and Trademark Office, of which contents are incorporated herein by reference.

BACKGROUND OF THE INVENTION

1. Field of the Invention

The present invention relates to a heating device for use in heating a semiconductor wafer and the like.

2. Description of the Related Art

In a manufacturing process of a semiconductor device, a heating process is implemented for a wafer in order to form an oxidation film and the like on the wafer by using a semiconductor manufacturing apparatus. As an example of a heating device for implementing the heating process in the semiconductor manufacturing apparatus, there is a ceramic heater including a disc-like ceramic base having a heating surface on which a heated object is set, in which a resistance heating body is embedded in the ceramic base. The resistance heating body of the ceramic heater is embedded in the ceramic base. Electric power is supplied to the resistance heating body, whereby the resistance heating body allows the heating surface to generate heat.

The ceramic heater as described above is required to be capable of heating the wafer as the heated object so that the wafer can be stably maintained at a predetermined heating temperature. Moreover, the ceramic heater is required to be capable of uniformly heating the entire surface of the wafer. Accordingly, as the ceramic heater, there is one in which the contrivance is made for planar wiring of the resistance heating body and one in which a bulk-like heat sink as a temperature control member is attached onto a surface on the other side of the heating surface in the disc-like ceramic base, and the like. The bulk-like heat sink can dissipate the heat rapidly from the ceramic base. Therefore, a local temperature rise of the heating surface can be suppressed. This contributes to the uniform heating in the heating surface.

There is a heating device in which the bulk-like heat sink and the ceramic base are bonded to each other, for example, by an adhesion layer of silicon resin. However, heat resistance of the silicon resin is low, and the operation temperature of the heating device is limited. Moreover, the silicon resin is inferior in thermal conductivity, and accordingly, there are limitations on such uniformly heating all over the surface of the wafer and maintaining.

In this connection, there is a heating device in which the bulk-like heat sink and the ceramic base are bonded to each other by a bonding layer formed by thermal compression bonding of an aluminum alloy (Japanese Patent Laid-Open Publication No. H9-249465 (published in 1997)).

However, even by the heating device having the bonding layer formed by the thermal compression bonding of the aluminum alloy, the in-plane uniformity of the heating temperature of the heating surface of the ceramic base has not been sufficient. In particular, when an amount of the incoming heat to the resistance heating body is increased, and when the ceramic base is formed of a material having low thermal conductivity, the heating uniformity (uniform heating performance) has not been sufficient, and hence, uniformity of a surface temperature of the wafer heated by the heating device has not been sufficient. If the uniformity of the surface temperature of the wafer is not sufficient, then uniformities of deposition and etching in the surface, which are implemented for the wafer, are not sufficient, resulting in a decrease of manufacturing yield of the semiconductor device.

The purpose of the present invention is one to solve the above-described problems advantageously. The present invention will provide a heating device that improves the uniform heating performance on the heating surface, thus making it possible to heat uniformly a heated object supported onto the heating surface.

SUMMARY OF THE INVENTION

In order to achieve the above-described aim, a heating device of the present invention has a ceramic base with a heating surface, and a heating body embedded in the ceramic base, the heating device including: a thermal conductive member disposed between the heating surface and the heating body in the ceramic base, wherein thermal conductivity of the thermal conductive member is higher than thermal conductivity of the ceramic base.

According to the heating device of the present invention, it becomes possible to heat uniformly the heated object attached onto the heating surface.

DETAILED DESCRIPTION OF THE INVENTION

A description will be made below of an embodiment of a heating device of the present invention by using the drawings.

Figure 1:
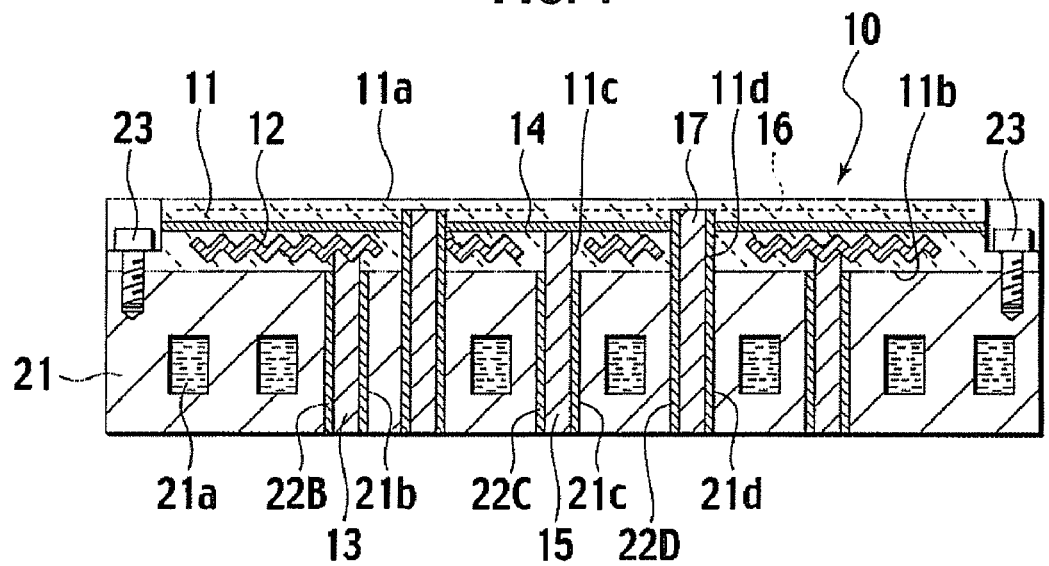
FIG. 1 is a cross-sectional view showing an embodiment according to a heating device of the present invention.

FIG. 1 is a cross-sectional view showing an embodiment according to the heating device of the present invention. Note that, in the drawing to be explained below, the respective constituents of the heating device are drawn while differentiating dimensional ratios thereof from those of an actual heating device for the purpose of facilitating the understanding of the respective constituents. Hence, the heating device according to the present invention is not limited to the dimensional ratios of the heating device illustrated in the drawing.

The heating device 10 of this embodiment, which is shown in FIG. 1, includes a disc-like ceramic base 11. For example, the ceramic base 11 is formed of alumina ($Al_2O_3$) ceramics or aluminum nitride (AlN) ceramics.

One planar portion of the ceramic base 11 having the disc shape is a heating surface 11a for heating, for example, a wafer (not shown) as a heated object to be set on the heating surface 11a. Close to a back surface 11b on the other side of the heating surface 11a in the ceramic base 11, a resistance heating body 12 is embedded.

Heater terminals 13 connected to the resistance heating body 12 are inserted into the ceramic base 11 from the back surface 11b thereof. Electric power is supplied to the resistance heating body 12 from an external power supply (not shown), whereby the resistance heating body 12 generates heat, and the generated heat transfers in the ceramic base 11 from the resistance heating body 12 toward the heating surface 11a of the ceramic base 11. In such a way, it becomes possible to heat the wafer set on the heating surface 11a.

A temperature control member 21 is attached onto the ceramic base 11 while being brought into intimate contact with the back surface 11b of the ceramic base 11. In the illustrate example, bolts 23 are individually inserted into a plurality of bolt holes formed in a circumferential edge portion of the ceramic base 11, and the bolts 23 are screwed to screw holes formed in the temperature control member 21, whereby the ceramic base 11 and the temperature control member 21 are fastened and fixed to each other. Moreover, the ceramic base 11 and the temperature control member 21 may be fixed to each other by adhesion using a resin adhesive.

The temperature control member 21 is formed of a metal material having good thermal conductivity, for example, bulk-like aluminum as a material capable of conducting and dissipating the heat of the ceramic base 11. In order to enhance such a heat dissipation effect by the temperature control member 21, fluid flowing holes 21a capable of flowing a cooling medium therethrough are formed in the temperature control member 21. Moreover, in the temperature control member 21, terminal holes 21b capable of inserting the heater terminals 13 therethrough are formed. In addition, tubular insulating members 22B are disposed in an inserted manner in contact with inner walls of the terminal holes 21b. The insulating members 22B insulate the heater terminals 13 disposed in an inserted manner on inner circumferential surface sides of the insulating members 22B and the temperature control member 21 formed of the metal material from each other.

One of characteristic structures of the heating device 10 of this embodiment is that a thermal conductive member 14 is disposed between the heating surface 11a of the ceramic base 11 and the resistance heating body 12 embedded in the ceramic base 11. In this illustrated embodiment, the thermal conductive member 14 is formed into a thin plate having substantially the same planar shape and diameter as those of the heating surface 11a, and is disposed substantially parallel to the heating surface 11a. The thermal conductive member 14 has higher thermal conductivity than the ceramic base 11.

The heating device 10 of this embodiment includes the thermal conductive member 14, thereby obtains the following effect. When the electric power is supplied to the resistance heating body 12, whereby the resistance heating body 12 generates the heat, a part of the generated heat transfers toward the heating surface 11a of the ceramic base 11. The heat that reaches the thermal conductive member 14 on the way toward the heating surface 11a not only transfers toward the heating surface 11a from the thermal conductive member 14 but also diffuses and transfers in a planar direction of the thermal conductive member 14 along an inside thereof. The heat diffuses and transfers in the planar direction of the thermal conductive member 14, whereby an amount of the heat that goes toward the heating surface 11a is equalized in the planar direction of the thermal conductive member 14. Accordingly, since the heat that goes toward the heating surface 11a from the thermal conductive member 14 is also equalized in the planar direction of the heating surface 11a, the uniformity of the temperature (the uniform heating performance) on the heating surface 11a is enhanced.

The above-described effect obtained in the heating device of this embodiment having the thermal conductive member 14 is significant when the ceramic base 11 is containing alumina as a main component. Thermal conductivity of the alumina is not as high as approximately 30 W/m·K. Accordingly, when the thermal conductive member 14 is not disposed, a partial amount of the heat that is generated from the resistance heating body 12 does not diffuse nor transfer in the planar direction of the ceramic base 11 in the inside thereof. The uniform heating performance has not been sufficient in the case of a conventional heating device that includes the ceramic base 11 made of the ceramics containing the alumina as the main component, that does not include the thermal conductive member 14. As opposed to this, the heating device of this embodiment includes the thermal conductive member 14, whereby the uniform heating performance can be enhanced remarkably, even if the heating device includes the ceramic base 11 containing the alumina as the main component.

With regard to the enhancement of the uniform heating performance, which is brought on by the heating device that includes the thermal conductive member 14, the thermal conductive member 14 is disposed between the heating surface 11a of the ceramic base 11 and the resistance heating body 12, and in the vicinity of the heating surface 11a, and accordingly, the thermal conductive member 14 effectively contributes to the enhancement of the uniform heating performance. Therefore, the heating device of this embodiment is remarkably excellent in uniform heating performance in comparison with the heating device of the prior art. Moreover, in the semiconductor wafer as the heated object heated by the heating device 10, only a little variation in temperature distribution thereof, even affects manufacturing yield of semiconductor device largely. Therefore, the enhancement of the uniform heating performance by the heating device 10 of this embodiment brings a quantum leap in enhancement of yield of a semiconductor device.

As the material for the thermal conductive member 14, a material that has higher thermal conductivity than the ceramic base 11 is adaptable. For example, when the ceramic base 11 is made of the alumina (thermal conductivity: approximately 30 W/m·K), it is preferable that the thermal conductive member 14 is made of the aluminum or an aluminum alloy (thermal conductivity: approximately 230 W/m·K). Moreover, without being limited to the aluminum or the aluminum alloy, the material for the thermal conductive member 14 may be indium, an indium alloy, or other metal materials, which have good thermal conductivity. Furthermore, without being limited to the metal material, the material for the thermal conductive member 14 may be the aluminum nitride (thermal conductivity: approximately 150 W/m·K) or highly thermal conductive ceramics.

In order to diffuse sufficiently the heat in the planar direction of the thermal conductive member 14, it is necessary that the thermal conductive member 14 have some thickness. For example, it is preferable that the thermal conductive member 14 have a thickness of approximately 0.5 to 5.0 mm. When the thermal conductive member 14 is thinner than approximately 0.5 mm, the diffusion of the heat in the planar direction is not sufficient, and the effect brought by disposing the thermal conductive member 14 becomes poor. Meanwhile, when the thermal conductive member 14 is thicker than approximately 5.0 mm, the effect brought by disposing the thermal conductive member 14 is saturated. The thickness of the thermal conductive member 14, which is approximately 0.5 to 5.0 mm, largely differs from a thickness of a metal-made electrode sometimes embedded between the heating surface and the resistance heating body, the metal-made electrode being used in the conventionally known heating device. For example, the metal-made electrode is an electrode for generating electrostatic force on the heating surface 11a, and a high-frequency electrode for generating plasma in the vicinity of the heating surface 11a. With the thickness of the electrode of the conventionally known heating device, it is difficult to obtain the enhancement of the uniform heating performance, which is intended in the present invention.

The ceramic base 11 is not limited to the above-described one made of the ceramics containing the alumina as the main component, and can be the one made of ceramics containing yttrium oxide as a main component. In this case, the thermal conductive member can be formed of a metal material, such as the aluminum or the aluminum alloy, the indium or the indium alloy, and others, having higher thermal conductivity than the yttrium oxide. Moreover, the ceramic base 11 can be a ceramic containing aluminum nitride as a main component. The ceramic base made of the aluminum nitride has volume resistivity suitable for generating the electrostatic force using the Johnson-Rahbek effect. The thermal conductive member in this case can be formed of a metal material, such as the aluminum or the aluminum alloy, and others, having higher thermal conductivity than the aluminum nitride.

In terms of enhancing the uniformity of the heating temperature (uniform heating performance) on the heating surface 11a, it is advantageous that the thermal conductive member 14 has substantially the same planar shape and size as those of the heating surface 11a of the ceramic base 11. However, the planar shape and size of the thermal conductive member 14 are not limited to the above. In short, it is satisfactory if the thermal conductive member 14 has such a shape and size that enables the enhancement of the uniform heating performance, and is disposed between the heating surface 11a and the resistance heating body 12 in the ceramic base 11.

For example, the resistance heating body 12 is formed of a high-melting-point metal material such as niobium (Nb), platinum (Pt), tungsten (W), and molybdenum (Mo), or carbide thereof (excluding that of the platinum). The resistance heating body 12 may be a planar resistance heating body formed by coating a material paste containing the metal material concerned thereon, and so on, or may be a coil-like resistance heating body. When the resistance heating body 12 is the coil-like resistance heating body molded from a wire material containing the niobium or the like, the resistance heating body 12 generates the heat three-dimensionally in the ceramic base 11. Accordingly, the coil-like resistance heating body 12 can enhance such substrate heating uniformity in the planar direction more than the planar resistance heating body. Moreover, since the coil-like resistance heating body is manufactured by processing a homogeneous wire material, variations of heat generation characteristics among the various lots of the heating devices are small. Moreover, a coil pitch and the like are locally varied, thus making it possible to easily adjust a temperature distribution on such substrate-mounting surface. Moreover, the coil-like resistance heating body can enhance adhesion thereof to the ceramic base 11 more than the planar resistance heating body.

Considering the suitable size and shape of the thermal conductive member 14, it is a more preferable mode that the ceramic base 11 has a three-layer structure in which the ceramic base 11 concerned is divided into two layers, which are an upper portion and a lower portion, and the thermal conductive member 14 is interposed between the upper portion and the lower portion. The heating device of this embodiment, which is shown in FIG. 1, has this preferable three-layer structure.

Moreover, the heating device can be formed into a structure in which the upper portion of the ceramic base 11 and the lower portion thereof, which are prepared individually, are bonded to each other by the thermal conductive member 14 by means of thermal compression bonding (TCB). Among the three layers, the thermal conductive member 14 is a member formed by means of the thermal compression bonding. In such a way, the upper portion of the ceramic base 11 and the lower portion thereof can be strongly bonded to each other without any gap over the entirety of bonded surfaces therebetween. Hence, the thermal conductive member 14 becomes to have an excellent effect without adversely affecting the strength of the entirety of the ceramic base 11.

It is preferable that the upper portion of the ceramic base 11 be one in which the volume resistivity at the operation temperature is $1\times10^8$ to $1\times10^{12}$ $\Omega\cdot$cm or $1\times10^{15}$ $\Omega\cdot$cm or more. The volume resistivity of $1\times10^8$ to $1\times10^{12}$ $\Omega\cdot$cm is suitable for generating the electrostatic force using the Johnson-Rahbek effect on the heating surface 11a. The volume resistivity of $1\times10^{15}$ $\Omega\cdot$cm or more is suitable for generating electrostatic force using the Coulomb force. Volume resistivity within a range from more than $1\times10^{12}$ $\Omega\cdot$cm to less than $1\times10^{15}$ $\Omega\cdot$cm is inadequate for generating the electrostatic force, and decreases a detachment response of the ceramic base 11 for the wafer after the wafer is adsorbed and held thereon. There is an apprehension that the volume resistivity of less than $1\times10^8$ $\Omega\cdot$cm may increase a leak current, which then adversely affects the wafer, and decreases the manufacturing yield.

It is preferable that the lower portion of the ceramic base 11 be one in which the volume resistivity at the operation temperature is $1\times10^8$ $\Omega\cdot$cm or more. When the volume resistivity is less than $1\times10^8$ $\Omega\cdot$cm, there is an apprehension that the leak current may be generated in the concerned lower portion concerned, leading to an occurrence of an insulation failure.

In the heating device 10 of this embodiment, the thermal conductive member 14 is disposed adjacent and parallel to the heating surface 11a of the ceramic base 11. Accordingly, it becomes possible to make use of the thermal conductive member 14 as the high-frequency electrode. In detail, as the heating device including the ceramic base 11, there is one in which a disc-like high-frequency electrode is embedded in the vicinity of the heating surface, and high-frequency plasma is generated by the high-frequency electrode in a space in the vicinity of a heated object set on the heating surface. In general, the high-frequency electrode is formed of an electrically conductive material capable of supplying high-frequency power. Accordingly, when the thermal conductive member 14 is formed of a metal material and the like in this embodiment, the thermal conductive member 14 is applicable as the high-frequency electrode. The heating device 10 of this embodiment, which is shown in FIG. 1, is an example where the thermal conductive member 14 also serves as the high-frequency electrode. Accordingly, holes 11c for making it possible to insert high-frequency electrode terminals 15 connected to the thermal conductive member 14 therethrough are formed so as to reach the thermal conductive member 14 from the back surface 11b of the ceramic base 11. Moreover, in the temperature control member 21, the terminal holes 21c are formed on extensions of the holes 11c, and the tubular insulating members 22C are inserted into the terminal holes 21c in contact with the inner walls thereof. In such a way, the tubular insulating members 22C insulate the high-frequency electrode terminals 15 inserted into the inner circumferential surface sides of the insulating members 22C and the temperature control member 21 formed of the metal material from each other. The high-frequency electrode terminals 15 are connected to the thermal conductive member 14 through the terminal holes 21c of the temperature control member 21 and the holes 11c of the ceramic base 11. The high-frequency power is supplied from the outside to the thermal conductive member 14 through the high-frequency electrode terminals 15, thus making it possible to use the thermal conductive member 14 as the high-frequency electrode. From this fact, it is not necessary to dispose a separate high-frequency electrode in the heating device 10 of this embodiment. When the thermal conductive member 14 is formed of a metal material, there is an apprehension that an exposed side of the thermal conductive member 14 corrodes by the generated high-frequency plasma. In order to prevent the corrosion of the thermal conductive member 14, it is preferable to protect the side of the thermal conductive member 14 with a corrosion-resistant material. For example, the side of the thermal conductive member 14 can be protected by disposing a film or a ring of the corrosion-resistant ceramics or the corrosion-resistant resin covered thereon. For a formation method of the concrete corrosion-resistant material, a thermal sprayed film of an alumina ceramics or a heat shrinkage ring made of fluoroplastics, etc. is used.

The heating device 10 of this embodiment can also have an electrostatic electrode, which holds, by the electrostatic force, the wafer set on the heating surface 11a of the ceramic base 11. That makes it possible to adsorb and hold the wafer by the electrostatic force when the wafer is heated. For this purpose, in the heating device 10 of this embodiment, an electrostatic electrode 16 is embedded in the ceramic base 11 more adjacent to the heating surface 11a than the thermal conductive member 14. Then, holes 11d are formed so as to reach the electrostatic electrode 16 from the back surface 11b of the ceramic base 11. The holes 11d are ones for making it possible to insert electrostatic electrode terminals 17 connected to the electrostatic electrode 16 therethrough. Moreover, terminal holes 21d are formed on extensions of the holes 11d in the temperature control member 21. Furthermore, the tubular insulating members 22D are disposed in an inserted manner in contact with inner walls of the terminal holes 21d, and insulate the electrostatic electrode terminals 17 inserted through inner circumferential surface sides of the insulating members 22D concerned and the temperature control member 21 formed of the metal material from each other. A voltage is applied from the outside to the electrostatic electrode 16 through the electrostatic electrode terminals 17, whereby a region between the electrostatic electrode 16 and the heating surface 11a is polarized to become a dielectric layer, thereby generating the electrostatic force on the heating surface 11a. The wafer can be adsorbed and held by the electrostatic force. In the ceramic base 11, when at least the region between the electrostatic electrode 16 and the heating surface 11a is made of the alumina, the electrostatic force derived from the Coulomb force can be strongly generated since the alumina has appropriate electrical resistivity. In the case of using the electrostatic force derived from the Coulomb force, it is not necessary to flow a micro current, on the heating surface 11a as in the electrostatic force derived from the Johnson-Rahbek force.

It is preferable that the electrostatic electrode 16 contain tungsten carbide (WC) and 10% or more of the alumina. The electrostatic electrode 16 contains the tungsten carbide as a main component, whereby diffusion of the component of the electrostatic electrode 16 into the ceramic base 11 made of alumina is extremely small. Accordingly, the volume resistivity of the alumina in the vicinity of the electrostatic electrode 16 can be increased. From this fact, insulation characteristics of the ceramic base 11 when a high voltage is applied thereto are enhanced. As a result of the increased resistance of the dielectric layer, detachment characteristics of the adsorbed substrate are enhanced. As the electrostatic electrode 16 contains 10% or more of the alumina, adhesiveness in the portion of the electrostatic electrode 16 is enhanced. From a viewpoint of reducing the electrical resistance of the portion of the electrostatic electrode 16 to an extent not to inhibit the high voltage or the high-frequency current to be supplied, it is preferable that an upper limit of a content of the alumina contained in the electrostatic electrode 16 to be approximately 50 wt % or less.

For example, the electrostatic electrode 16 can be formed by printing paste containing mixed powder of predetermined amounts of the alumina and the tungsten carbide on a planar shape with a mesh shape, a comb shape, a spiral shape, or the like. Note that, in the heating device 10 of this embodiment, which is shown in FIG. 1, an example of a bipolar type is shown as the electrostatic electrode 16. However, without being limited to the bipolar type, the electrostatic electrode 16 may be of a uni-polar type or a multi-polar type.

The heating device having the electrostatic electrode 16 is preferably formed into the three-layer structure in which the ceramic base 11 is divided into two layers, which are the upper portion and the lower portion, and the thermal conductive layer 14 is interposed between the upper portion and the lower portion. In the heating device as described above, it is preferable to adopt a structure, in which the electrostatic electrode 16 is contained in the upper portion of the ceramic base 11, and the resistance heating body 12 is contained in the lower portion of the ceramic base 11. The electrostatic electrode 16 is embedded in the vicinity of the heating surface 11a of the ceramic base 11, and accordingly, is contained in the upper portion of the ceramic base 11. Moreover, the thermal conductive member 14 is disposed for the purpose of diffusing and conducting the heat in the planar direction of the thermal conductive member 14 while the heat goes from the resistance heating body 12 toward the heating surface 11a of the ceramic base 11.

An example of a manufacturing method of the heating device 10 of this embodiment, includes the steps of: individually fabricating the upper portion and lower portion of the ceramic base 11; and bonding the upper portion and the lower portion to each other with the thermal conductive member 14 by means of the thermal compression bonding.

For example, the thermal compression bonding can be performed in such a manner that the aluminum is used as the thermal conductive member 14. The upper portion and lower portion of the ceramic base 11, which are fabricated in advance, are stacked on each other while sandwiching the aluminum made thermal conductive member 14 therebetween, and are then heated to a predetermined temperature while applying a pressure thereto in a thickness direction. The temperature should be 1-40 degree C. less than the melting point of the thermal conductive member and the pressure should be 25-80 kg/cm$^2$, so that the thermal conductive member bonds the ceramic bases firmly without changing the dimensions of the stacked layers. As the conductive member will not change its dimensions, the ceramic base can have any through-holes in it. According to this method, the thickness of the aluminum-made thermal conductive member can be 0.5-5 mm. The thickness is significantly thick enough to diffuse the heat to the planar direction.

The upper portion and lower portion of the ceramic base 11, which are used in the thermal compression bonding, are individually fabricated. In such a way, the upper portion and lower portion of the ceramic base 11 can also be formed of ceramics different in type from each other. For example, the upper portion can be formed of the ceramics containing the yittria as the main component, and the lower portion can be formed of the ceramics containing the alumina as the main component.

Examples

A ceramic sintered body that would become the upper portion of the ceramic base 11, a ceramic sintered body that would become the lower portion of the ceramic base 11, and the thermal conductive member 14 were individually prepared.

With regard to the ceramic sintered body that would become the upper portion of the ceramic base 11, press molding was performed for forming a compact body from raw material powder at a predetermined pressure by using a metal die. Thereafter, the compact body was sintered by using a hot press sintering method, and a sintered body in which the electrostatic electrode was embedded was obtained. Similarly, with regard to the ceramic sintered body that would become the lower portion of the ceramic base 11, press molding was performed for forming a compact body from raw material powder at a predetermined pressure by using a metal die. Thereafter, the compact body was sintered by using a hot press sintering method, and a sintered body in which the resistance heating body was embedded was obtained.

The thermal conductive member 14 was sandwiched between the ceramic sintered body that would become the upper portion and the ceramic sintered body that would become the lower portion. Then, when the thermal conductive member 14 was made of Al, the thermal compression bonding was performed for the upper and lower portions and the thermal conductive member 14 by heating these members at 540° C. for 5 hours while applying a pressure of 40 kgf/cm² thereto in the thickness direction. When the thermal conductive member 14 was made of In, the thermal compression bonding was performed for these members by heating these members at 130° C. for 5 hours while applying a pressure of 10 kgf/cm² thereto in the thickness direction. In such a way, there was obtained the ceramic base 11 shown in FIG. 1, which had the three-layer structure in which the upper portion of the ceramic base 11, a thermal compression bonding layer composed of the thermal conductive member 14, and the lower portion of the ceramic base 11 were stacked on one another.

After the thermal compression bonding described above, a planar grinding process was performed for the heating surface of the ceramic base by a diamond grindstone. Moreover, side surfaces of the sintered bodies were ground, and in addition, necessary drilling process and terminal attachment process were performed, and the ceramic base 11 was completed.

The obtained ceramic base was fastened and fixed by the bolts to the temperature control member made of the bulk like aluminum, and the heating device of this embodiment was obtained.

Figure 2:
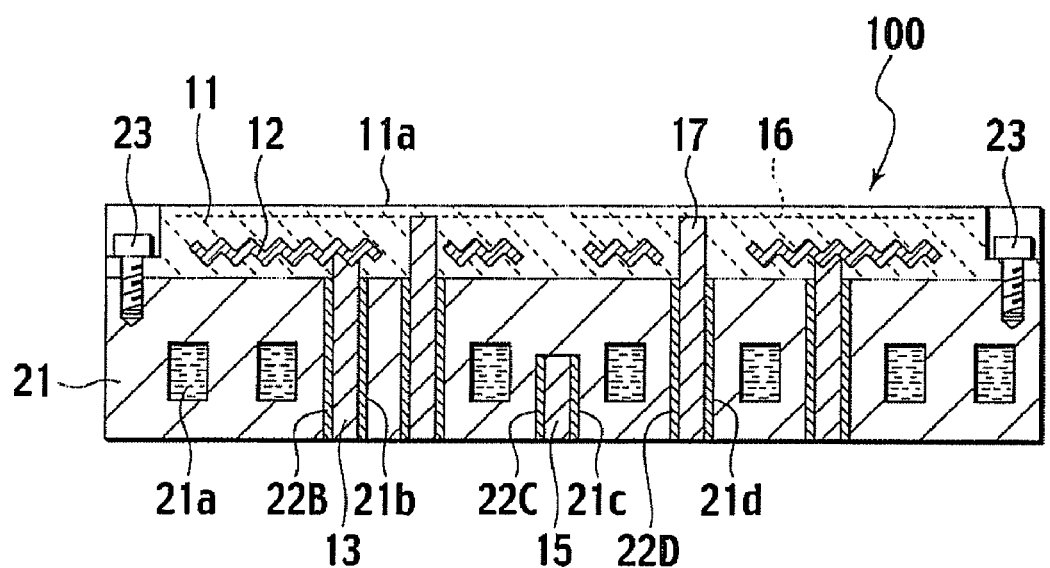
FIG. 2 is a cross-sectional view of an example of a conventional heating device.

As a comparative example, a heating device with the same configuration as that of this embodiment except that the thermal conductive member was not disposed as fabricated. FIG. 2 shows a cross-sectional view of this comparative heating device. Note that, in the heating device 100 shown in FIG. 2, the same reference numerals are assigned to the same members as those in FIG. 1, and accordingly, a duplicate description will be omitted.

Figure 3:
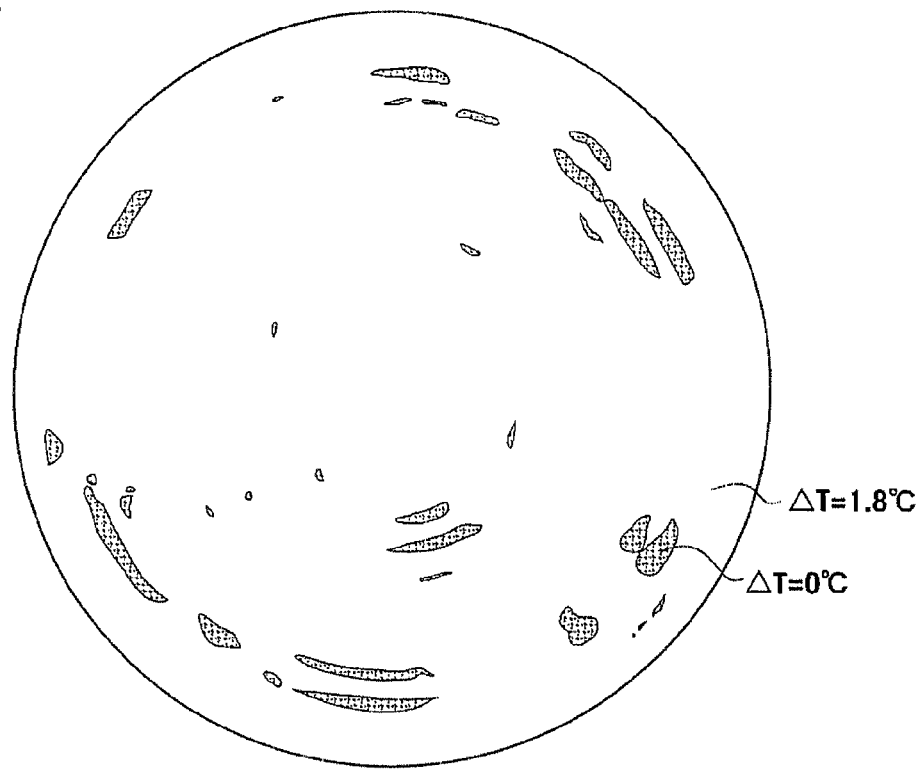
FIG. 3 is a view showing a temperature distribution of a heating surface of the heating device of the present invention.
Figure 4:
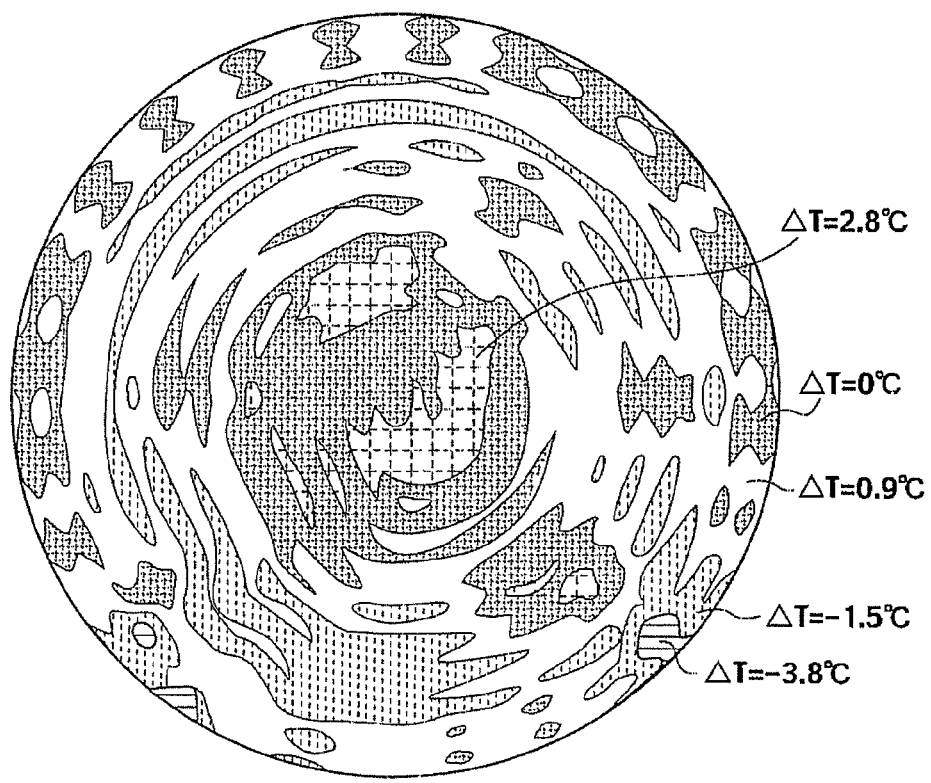
FIG. 4 is a view showing a temperature distribution of a heating surface of the conventional heating device.

The respective heating devices thus obtained were heated so that the heating surfaces thereof could reach 100° C., and the temperature distributions of the heating surfaces concerned were investigated. FIG. 3 shows an example of a measurement result of the in-plane temperature distribution of the surface in the example, and FIG. 4 shows an example of a measurement result of the in-plane temperature distribution of the surface in the comparative example. The examples of the results, which are shown in FIG. 3 and FIG. 4, were obtained by using a measurement device including an infrared spectroscopic camera. From the comparison between FIG. 3 and FIG. 4, it is understood that, in the example, the variations of the temperature distribution are smaller than in the comparative example.

In a similar way to the above, the in-plane temperature variations of the surface (the uniform heating performance) were investigated for heating devices of Examples 1 to 13 and Comparative examples 1 and 2. Results of the investigations are shown in Table 1-1 and Table 1-2.

TABLE 1-1

| | | Example No. | | | | | | | |
|---|---|---|---|---|---|---|---|---|---|
| | | 1 | 2 | 3 | 4 | 5 | 6 | 7 | 8 |
| Thermal conductive member | Material | Al | In | Al | Al | Al | Al | Al | Al |
| | Thickness [mm] | 1 | 1 | 1 | 1 | 0.5 | 2 | 2.5 | 4 |
| | Thermal conductivity [W/m-K] | 237 | 82 | 237 | 237 | 237 | 237 | 237 | 237 |
| Upper ceramic base | Material | $Al_2O_3$ | $Al_2O_3$ | AlN | $Y_2O_3$ | $Al_2O_3$ | $Al_2O_3$ | $Al_2O_3$ | $Al_2O_3$ |
| | Thickness [mm] | 2 | 2 | 2 | 2 | 2 | 2 | 2 | 2 |
| | Thermal conductivity [W/m-K] | 30 | 30 | 100 | 15 | 30 | 30 | 30 | 30 |
| | Thermal expansion [ppm/K] | 7.8 | 7.8 | 5.0 | 8.0 | 7.8 | 7.8 | 7.8 | 7.8 |
| | Volume resistivity [Ω · cm] | $1.0 \times 10^{16}$ | $1.0 \times 10^{16}$ | $1.0 \times 10^{10}$ | $1.0 \times 10^{16}$ | $1.0 \times 10^{16}$ | $1.0 \times 10^{16}$ | $1.0 \times 10^{16}$ | $1.0 \times 10^{16}$ |
| | Embedded electrode | ESC | ESC | ESC | ESC | ESC | ESC | ESC | ESC |
| Lower ceramic base | Material | $Al_2O_3$ | $Al_2O_3$ | AlN | $Y_2O_3$ | $Al_2O_3$ | $Al_2O_3$ | $Al_2O_3$ | $Al_2O_3$ |
| | Thickness [mm] | 4 | 4 | 4 | 4 | 4 | 4 | 4 | 4 |
| | Thermal conductivity [W/m-K] | 30 | 30 | 100 | 15 | 30 | 30 | 30 | 30 |
| | Thermal expansion [ppm/K] | 7.8 | 7.8 | 5.0 | 8.0 | 7.8 | 7.8 | 7.8 | 7.8 |

TABLE 1-1-continued

|  |  | Example No. | | | | | | | |
| --- | --- | --- | --- | --- | --- | --- | --- | --- | --- |
|  |  | 1 | 2 | 3 | 4 | 5 | 6 | 7 | 8 |
|  | Volume resistivity [Ω·cm] | $1.0 \times 10^{16}$ | $1.0 \times 10^{16}$ | $1.0 \times 10^{10}$ | $1.0 \times 10^{16}$ | $1.0 \times 10^{16}$ | $1.0 \times 10^{16}$ | $1.0 \times 10^{16}$ | $1.0 \times 10^{16}$ |
|  | Embedded electrode | Heater | Heater | Heater | Heater | Heater | Heater | Heater | Heater |
| Uniform heating performance | [° C.] | 1.8 | 3.9 | 0.9 | 2.8 | 3.7 | 1.4 | 1.2 | 1.0 |
| Temperature rise rate@ 7000 W | [° C./sec] | 2.0 | 2.0 | 1.6 | 2.1 | 2.2 | 1.8 | 1.7 | 1.2 |

TABLE 1-2

|  |  | Example No. | | | | | Comparative example No. | |
| --- | --- | --- | --- | --- | --- | --- | --- | --- |
|  |  | 9 | 10 | 11 | 12 | 13 | 1 | 2 |
| Thermal conductive member | Material | Al | Al | In | Al | Al | None | None |
|  | Thickness [mm] | 5 | 1 | 1 | 1 | 1 | — | — |
|  | Thermal conductivity [W/m-K] | 237 | 237 | 237 | 237 | 237 | — | — |
| Upper ceramic base | Material | $Al_2O_3$ | $Y_2O_3$ | $Al_2O_3$ | AlN | AlN | $Al_2O_3$ | $Y_2O_3$ |
|  | Thickness [mm] | 2 | 2 | 2 | 2 | 2 | 2 | 2 |
|  | Thermal conductivity [W/m-K] | 30 | 30 | 30 | 100 | 100 | 30 | 15 |
|  | Thermal expansion [ppm/K] | 7.8 | 7.8 | 7.8 | 5.0 | 5.0 | 7.4 | 7.8 |
|  | Volume resistivity [Ω·cm] | $1.0 \times 10^{16}$ | $1.0 \times 10^{16}$ | $1.0 \times 10^{14}$ | $1.0 \times 10^{7}$ | $1.0 \times 10^{10}$ | $1.0 \times 10^{16}$ | $1.0 \times 10^{16}$ |
|  | Embedded electrode | ESC | ESC | ESC | ESC | ESC | ESC, Heater | ESC, Heater |
| Lower ceramic base | Material | $Al_2O_3$ | $Al_2O_3$ | $Al_2O_3$ | AlN | AlN | — | — |
|  | Thickness [mm] | 4 | 4 | 4 | 4 | 4 | — | — |
|  | Thermal conductivity [W/m-K] | 30 | 30 | 30 | 100 | 100 | — | — |
|  | Thermal expansion [ppm/K] | 7.8 | 8.0 | 7.8 | 5.0 | 5.0 | — | — |
|  | Volume resistivity [Ω·cm] | $1.0 \times 10^{16}$ | $1.0 \times 10^{16}$ | $1.0 \times 10^{16}$ | $1.0 \times 10^{10}$ | $1.0 \times 10^{6}$ | — | — |
|  | Embedded electrode | Heater | Heater | Heater | Heater | Heater | — | — |
| Uniform heating performance | [° C.] | 0.9 | 2.0 | 1.9 | 1.1 | 2.0 | 6.6 | 12.6 |
| Temperature rise rate@ 7000 W | [° C./sec] | 0.9 | 2.0 | 2.0 | 1.7 | 2.5 | 2.0 | 2.2 |

From Table 1-1 and Table 1-2, it is understood that, in Examples 1 to 13 where the thermal conductive members are disposed, the variations of the in-plane temperature distributions of the surfaces are smaller than that in Comparative examples 1 and 2. The heating device of this embodiment can remarkably enhance the uniform heating performance of the heated object.

Note that, in Example 10, a difference in thermal expansion coefficient between the upper portion and lower portion of the ceramic base 11 was 0.2 ppm/K. A warp of 0.1 mm occurred after the bonding was performed. In Example 11, the volume resistivity of the upper portion of the ceramic base 11 was $1 \times 10^{14}$ Ω·cm, and accordingly, it took 60 sec to detach the wafer from the heating device, and a throughput was decreased. In Example 12, the volume resistivity of the upper portion of the ceramic base 11 was $1 \times 10^{7}$ Ω·m, and accordingly, a leak current of more than 1 mA was generated. In Example 13, the volume resistivity of the lower portion of the ceramic base 11 was $6 \times 10^{6}$ Ω·cm, and accordingly, a leak current was generated in the heater unit.

Moreover, in the heating device of this embodiment, when the high-frequency power was supplied thereto from the terminals connected to the thermal conductive member, a plasma atmosphere was able to be generated in the vicinity of the heating surface.

The description has been made above of the heating device of the present invention by using the drawings and the embodiment; however, the heating device of the present invention is not limited to these drawings and embodiment, and it is possible to modify the heating device of the present invention in various ways without departing from the gist of the present invention.

What is claimed is:
1. A heating device comprising:
a base made of ceramics having a heating surface and an electrostatic electrode,
a heating body embedded in the ceramic base, a metallic thermal conductive member disposed between the heating surface and the heating body in the ceramic base, wherein the thermal conductive member is provided parallel to the heating surface, with distinct substantially continuous sectional layers that in combination have a planar shape and an overall size that is substantially the same as that of the heating surface, and wherein thermal conductivity of the thermal conductive member is higher than thermal conductivity of the ceramic base.

2. The heating device according to claim 1, wherein the base is made of ceramics containing alumina as a main component.

3. The heating device according to claim 1, wherein the base is made of ceramics containing yttrium oxide as a main component.

4. The heating device according to claim 1, wherein the base is made of ceramics containing aluminum nitride as a main component.

5. The heating device according claim 1, wherein the thermal conductive member is made of aluminum or an aluminum alloy.

6. The heating device according claim 1, wherein the thermal conductive member is made of indium or an indium alloy.

7. The heating device according to claim 1, wherein a thickness of the thermal conductive member is approximately 0.5 to 5.0 mm.

8. The heating device according to claim 1, wherein the thermal conductive member is a member formed by thermal compression bonding.

9. The heating device according to claim 1, wherein the thermal conductive member also serves as a high-frequency electrode.

10. The heating device according to claim 1, wherein the ceramic base is formed into a three-layer structure, in which the ceramic base is divided into two layers which are an upper portion and a lower portion, and the thermal conductive member is interposed between the upper portion and the lower portion.

11. The heating device according claim 1, wherein the electrostatic electrode is contained in the upper portion of the ceramic base, and the heating body is contained in the lower portion of the ceramic base.

* * * * *